United States Patent
Kwean

(10) Patent No.: US 6,909,643 B2
(45) Date of Patent: Jun. 21, 2005

(54) SEMICONDUCTOR MEMORY DEVICE HAVING ADVANCED DATA STROBE CIRCUIT

(75) Inventor: Ki-Chang Kwean, Ichon-shi (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/749,353

(22) Filed: Dec. 31, 2003

(65) Prior Publication Data

US 2004/0218424 A1 Nov. 4, 2004

(30) Foreign Application Priority Data

Apr. 29, 2003 (KR) .................................. 10-2003-0026942

(51) Int. Cl.[7] ............................................... G11C 7/00
(52) U.S. Cl. ................... 365/193; 365/189.05; 711/105
(58) Field of Search .......................... 365/193, 189.05; 711/105

(56) References Cited

U.S. PATENT DOCUMENTS

| 5,892,730 | A | 4/1999 | Sato et al. | |
| 6,134,180 | A | 10/2000 | Kim et al. | |
| 6,310,823 | B1 * | 10/2001 | Nam | 365/233 |
| 6,381,180 | B1 | 4/2002 | Merritt et al. | |
| 6,525,971 | B2 | 2/2003 | Merritt et al. | |
| 6,615,325 | B2 | 9/2003 | Mailloux et al. | |
| 6,728,144 | B2 * | 4/2004 | Nygren | 365/193 |
| 2003/0021177 | A1 | 1/2003 | La | |
| 2003/0156481 | A1 | 8/2003 | Pujisawa | |

FOREIGN PATENT DOCUMENTS

JP      10-334659      12/1998

* cited by examiner

*Primary Examiner*—Van Thu Nguyen
*Assistant Examiner*—N Nguyen
(74) *Attorney, Agent, or Firm*—Blakely Sokoloff Taylor & Zafman

(57) ABSTRACT

A data strobe circuit for prefetching M number of N bit data, N and M being a positive integer, includes a data strobe buffering unit for generating N number of align control signals based on a data strobe signal; a synchronizing block having M number of latch blocks, each for receiving N bit data and outputting the N−1 bit data in a parallel fashion in response to N−1 number of the align control signals and one bit prefetched data in response to the remaining align control signals; and a output block having M number of aligning blocks, each for receiving the N−1 bit data in the parallel fashion, synchronizing the N−1 bit data with the align control signal and outputting the synchronized N−1 bit data as the N−1 bit prefetched data.

16 Claims, 10 Drawing Sheets

FIG. 3
(PRIOR ART)
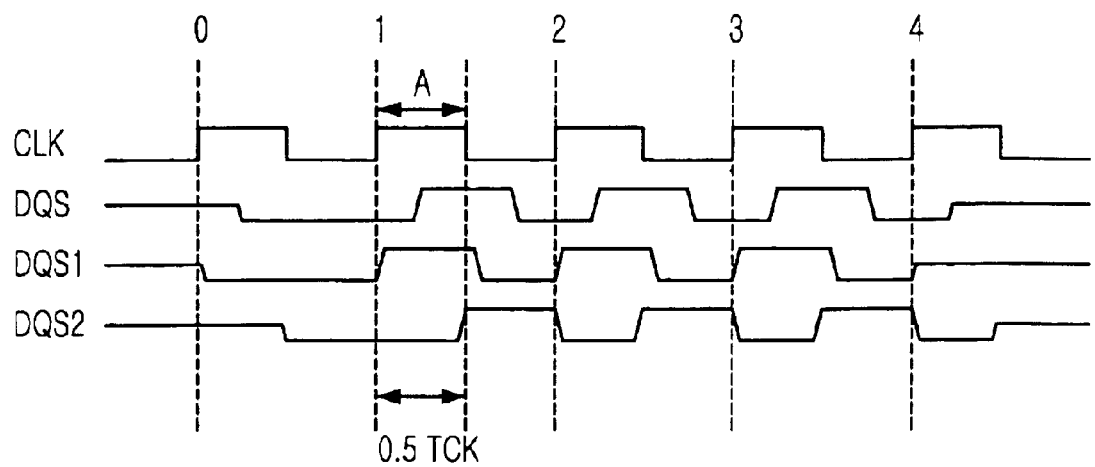
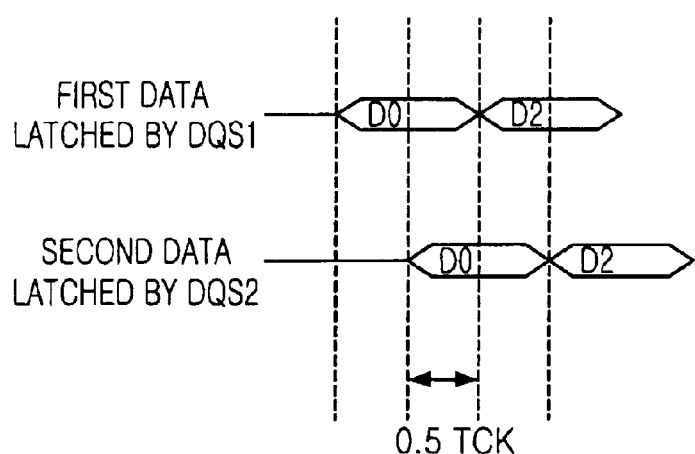

SEMICONDUCTOR MEMORY DEVICE HAVING ADVANCED DATA STROBE CIRCUIT

FIELD OF INVENTION

The present invention relates to a semiconductor memory device; and, more particularly, to a data strobe circuit in the semiconductor memory device for having more timing margin at data writing operation.

DESCRIPTION OF PRIOR ART

Generally, in a Double Data Rate Synchronous Dynamic Random Access Memory (hereinafter, referred as a DDR SDRAM), a method of prefetching 2-bit data or 4-bit data has been used for increasing operation speed of the DDR SDRAM. However, some significant problem is occurred, because there is little timing margin when the DDR SDRAM in accordance with the prior art prefetches each bit of a plural bit data. As a result, in order to increase the operation speed of the DDR SDRAM, the method of prefetching the plural bit data is considered as a limited condition.

FIG. 1A is a block diagram depicting a data strobe circuit of the DDR SDRAM in accordance with the prior art, and FIG. 1B is a schematic circuit diagram describing a divided first/second data block 160 in the data strobe circuit of the DDR SDRAM in accordance with the prior art.

As shown in FIG. 1A, the data strobe circuit of the DDR SDRAM includes a data strobe input buffer 110, a data input buffer 120, a data rising input latch 130, a data falling input latch 140, a first data dividing block 150 and a second data dividing block 160.

The data strobe input buffer 110 receives a data strobe signal DQS which is served as a reference signal for arranging inputted data. If a start buffering signal STARTZ is enabled by a data writing instruction, the data strobe input buffer 110 outputs a data strobe rising signal DSR0 and a data strobe falling signal DSF0. Herein, the start buffering signal STARTZ is used for enabling the data strobe input buffer 110.

The data input buffer 120 outputs the inputted data to the data rising input latch 130 and data falling input latch 140, if a start buffering signal STARTZ is enabled by a data writing instruction.

The data rising input latch 130 receives the data strobe rising signal DSR0 which is inputted from the data strobe input buffer 110 and latches the output of the data input buffer 120. The data falling input latch 140 receives the data strobe falling signal DSF0 which is inputted from the data strobe input buffer 110 and latches the output of the data input buffer 120. Herein, the data rising input latch 130 controlled by the data strobe rising signal DSR0 outputs a rising aligned data ALIGN_DSR0_DATA at the simultaneous timing of outputting a falling aligned data ALIGN_DSF0_DATA from the data falling input latch 140.

The first and second data dividing blocks 150 and 160 receive the rising and falling aligned data ALIGN_DSR0_DATA and ALIGN_DSF0_DATA. The first and second data dividing blocks 150 and 160 respectively output the first aligned data ALIGN_FIRST_DATA[0:1] at a first rising edge of the data strobe falling signal DSF0 and the second aligned data ALIGN_SECOND_DATA[0:1] at a second rising edge of the data strobe falling signal DSF0.

FIG. 2 is a timing diagram showing writing operation of the data strobe circuit of the DDR SDRAM in accordance with the prior art. As above statement, after receiving the data strobe signal DS, the data strobe circuit generates the data strobe rising and falling signals DSR0 and DSF0 and outputs the first and second aligned data in response to the data strobe falling signal DSF0.

As shown, the data strobe circuit may-have timing margin as long as a half period of an external clock CLK, when the outputted first and second aligned data ALIGN_FIRST_DATA[0:1] and ALIGN_SECOND_DATA[0:1] from the data strobe circuit is synchronized with the external clock CLK. Namely, the first and second aligned data should be outputted by the data strobe falling signal DSF0 during the half period of the external clock CLK. Generally, when one data strobe signal, e.g., DS, is inputted to the data strobe circuit, eight data which are synchronized with the data strobe signal are inputted to the data strobe circuit. In case of the data strobe circuit receiving a plurality of data strobe signals, each data strobe signal is inputted not simultaneously but sequentially. As a result, a clock skew between inputted data strobe signals is occurred.

FIG. 3 is a timing diagram demonstrating data strobe signals, e.g., DQS, DQS1, DQS2, as compared with the external clock CLK.

The timing margin between the data strobe signals may be defined by using the tDQSS, i.e., time from a rising edge of the external clock CLK to a first rising edge of the data strobe signal. For instance, the first data strobe signal DQS1 which is the earliest may be enabled past 0.75 tCK after a writing instruction is inputted. Herein, 1 tCK means one period of the external clock CLK. The second data strobe signal DQS2 which is the latest may be enabled past 1.25 tCK after the writing instruction is inputted. Namely, the data strobe signals are inputted at different timings in response to circumstances, not at a simultaneous timing.

In the case shown in FIG. 3, first and second aligned data which are arranged by each data strobe signal have the timing margin as long as 0.5 tCK. As a result, the latest data among a plurality of data inputted by a first writing instruction should be latched by not a control signal of clock domain but the data strobe signal, before the earliest data among a plurality of data is inputted by a second writing instruction. Namely, each aligned data has 0.5 tCK timing margin as a reference clock for operation is changed from the data strobe signal DS into the external clock CLK. Therefore, the shorter one period, i.e., 1 tCK, of the external clock CLK is, the shorter the timing margin, i.e., 0.5 tCK, of each aligned data is; and the data strobe circuit of the prior art is not suited to high speed operation of semiconductor memory device by using a high frequency.

SUMMARY OF INVENTION

It is, therefore, an object of the present invention to provide a semiconductor memory device having an advanced data strobe circuit in order to guarantee enough timing margin of data arranging operation by using a method of separating process of generating data strobe signals from process of receiving sequentially inputted data.

In accordance with an aspect of the present invention, there is provided a data strobe circuit for prefetching M number of N bit data, N and M being a positive integer, including a data strobe buffering unit for generating N number of align control signals based on a data strobe signal; a synchronizing block having M number of latch blocks, each for receiving N bit data and outputting the N−1 bit data in a parallel fashion in response to N−1 number of the align control signals and one bit prefetched data in response to the remaining align control signals; and a output block having M number of aligning blocks, each for receiving the N−1 bit data in the parallel fashion, synchronizing the N−1 bit data with the align control signal and outputting the synchronized N−1 bit data as the N−1 bit prefetched data.

BRIEF DESCRIPTION OF DRAWINGS

The above and other objects and features of the present invention will become apparent from the following description of preferred embodiments taken in conjunction with the accompanying drawings, in which:

FIG. 3 is a timing diagram demonstrating data strobe signals as compared with the external clock;

DETAILED DESCRIPTION OF THE INVENTION

Hereinafter, a semiconductor memory device having an advanced data strobe circuit according to the present invention will be described in detail referring to the accompanying drawings.

Figure 1A:
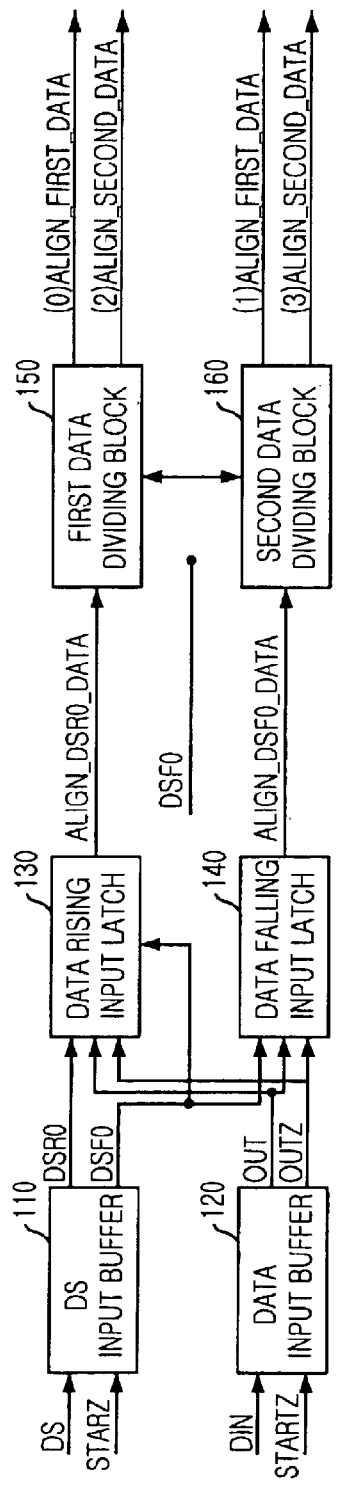
FIG. 1A is a block diagram depicting a data strobe circuit of the DDR SDRAM in accordance with the prior art.
Figure 1B:
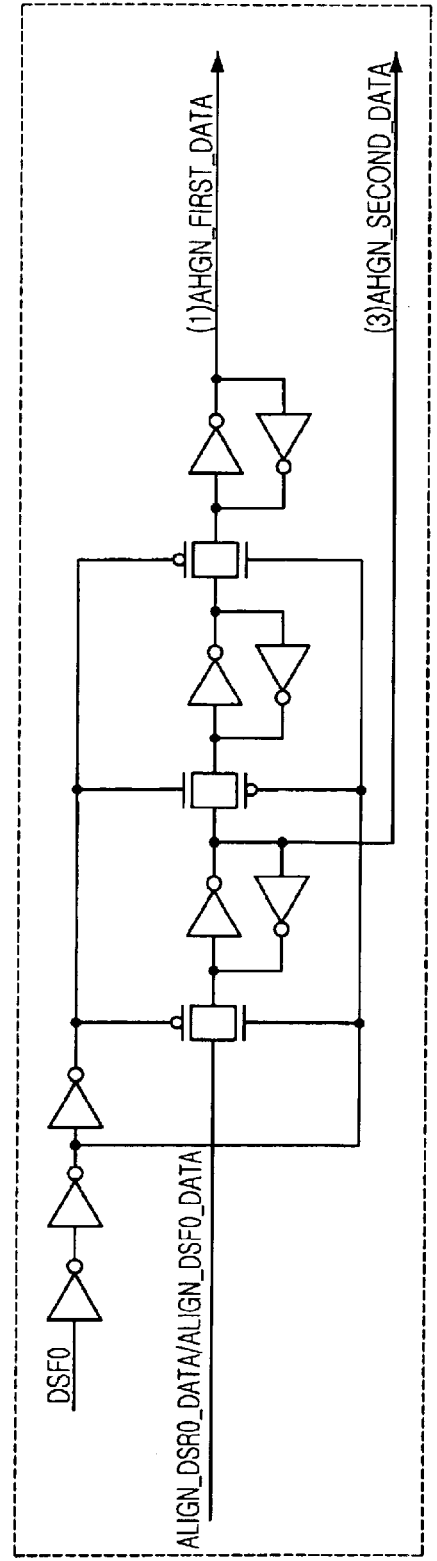
FIG. 1B is a schematic circuit diagram describing a divided first/second data block in the data strobe circuit of the DDR SDRAM in accordance with the prior art.
Figure 2:
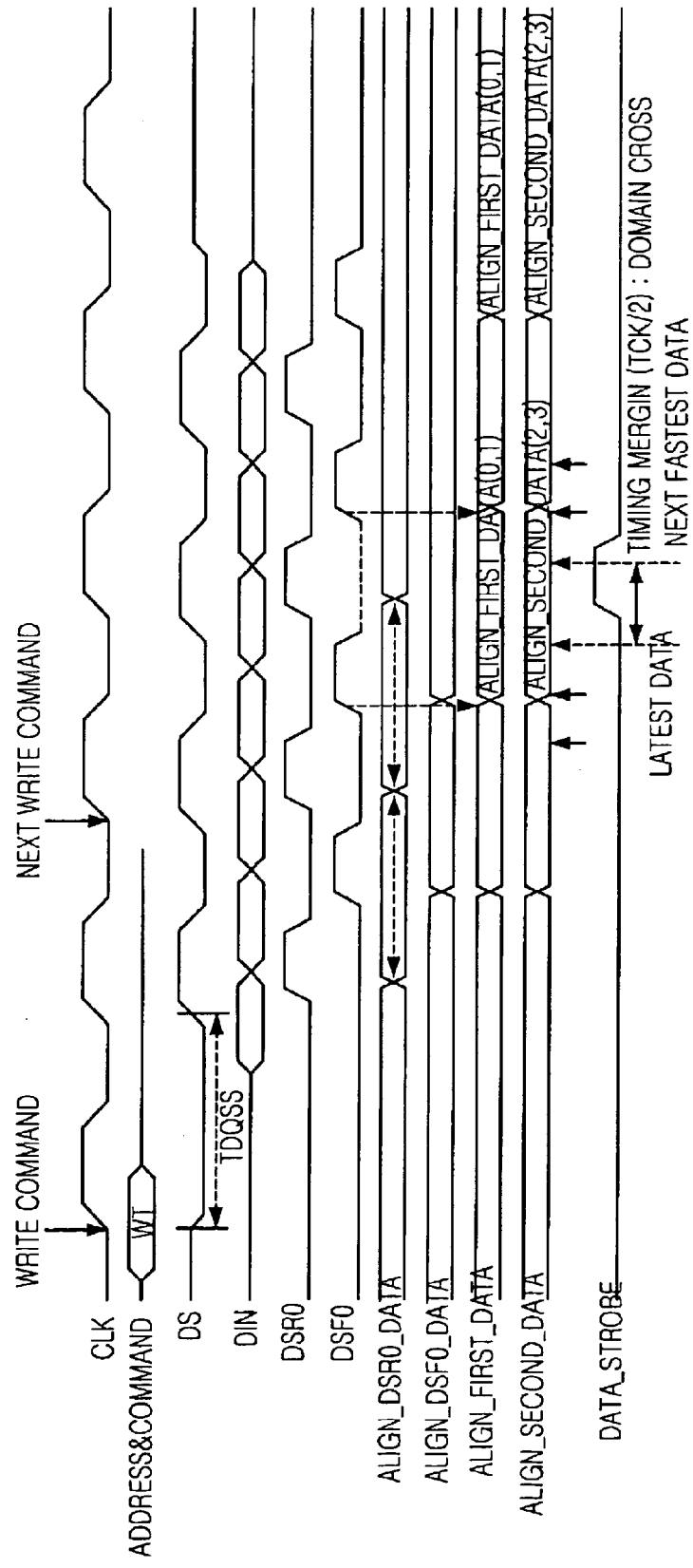
FIG. 2 is a timing diagram showing writing operation of the data strobe circuit of the DDR SDRAM in accordance with the prior art.
Figure 4:
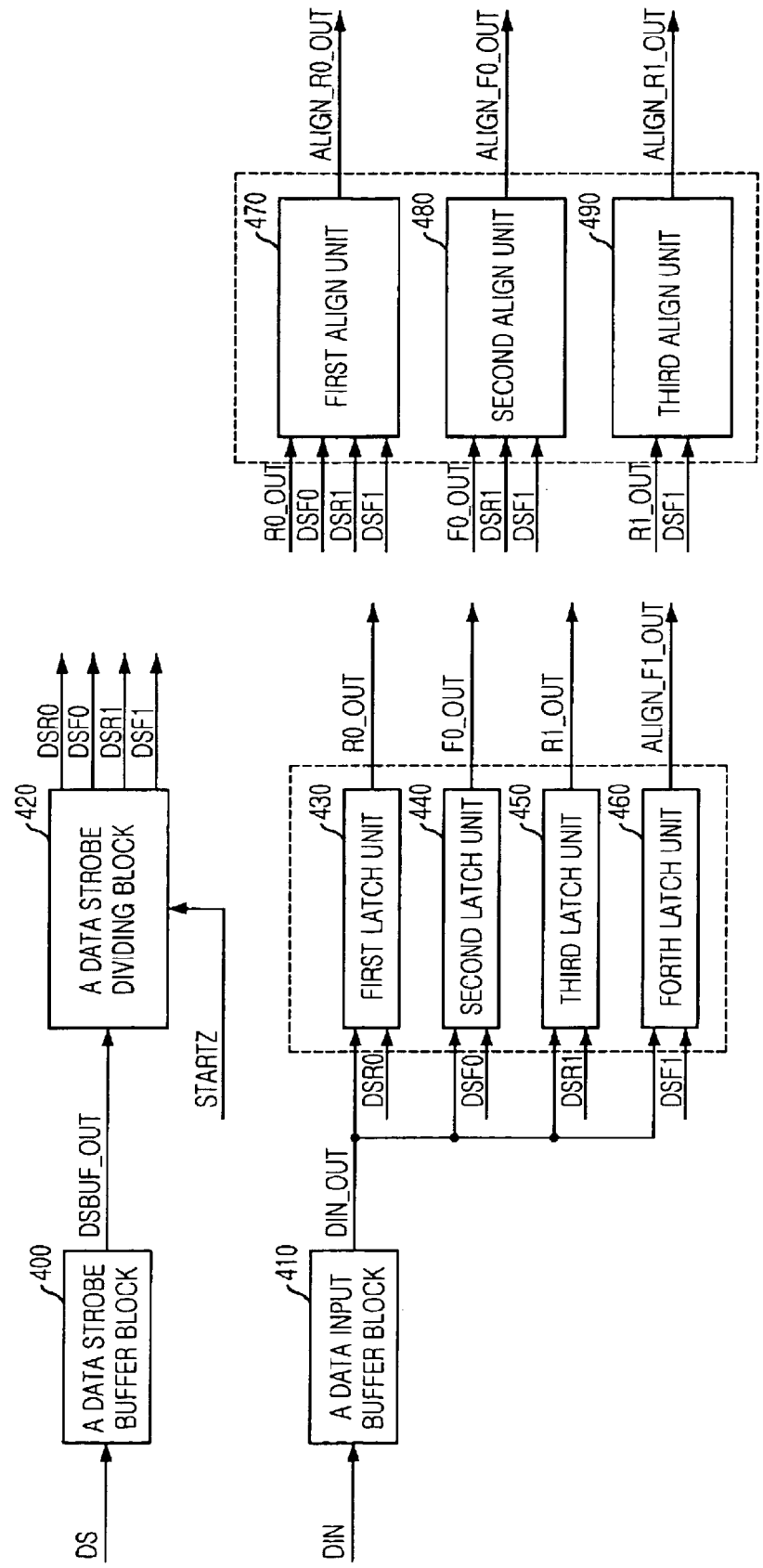
FIG. 4 is a block diagram showing a data strobe circuit in accordance with an embodiment of the present invention.

FIG. 4 is a block diagram showing a data strobe circuit in accordance with an embodiment of the present invention.

As shown, the data strobe circuit includes a data strobe buffer block 400, a data strobe dividing block 420, a data input buffer block 410, a latch block having first to forth latch units 430 to 460 and a data align block having first to third align units 470 to 490.

Figure 5:
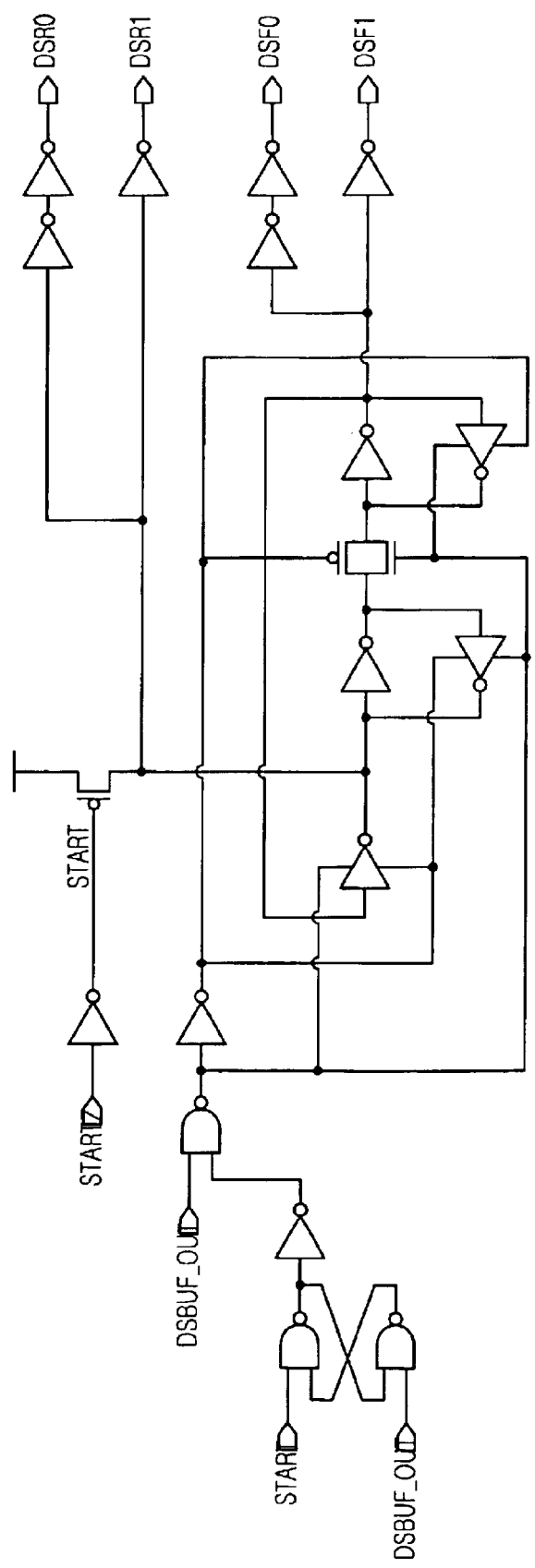
FIG. 5 is a schematic circuit of a data strobe dividing block of the data strobe circuit shown in FIG. 4.

The data strobe buffer block 400 receives a data strobe signal DS and outputs a buffered data strobe signal DSBUF_OUT. The data input buffer block 410 receives an input data DIN and outputs a buffered input data DIN_OUT. The data strobe dividing block 420 receives the buffered data strobe signal DSBUF_OUT and generates first rising and falling data strobe signals DSR0 and DSF0 and second rising and falling data strobe signals DSR1 and DSF1. Herein, the first rising and falling data strobe signals DSR0 and DSF0 and the second rising and falling data strobe signals DSR1 and DSF1 are sequentially synchronized with a first rising edge, a first falling edge, a second rising edge and a second falling edge of the buffered data strobe signal DSBUF_OUT. Of course, the data strobe dividing block 420 is operated at point of timing when a strobe enabling signal STARTZ is enabled. A schematic circuit of the data strobe dividing block 420 is described in FIG. 5.

Figure 6:
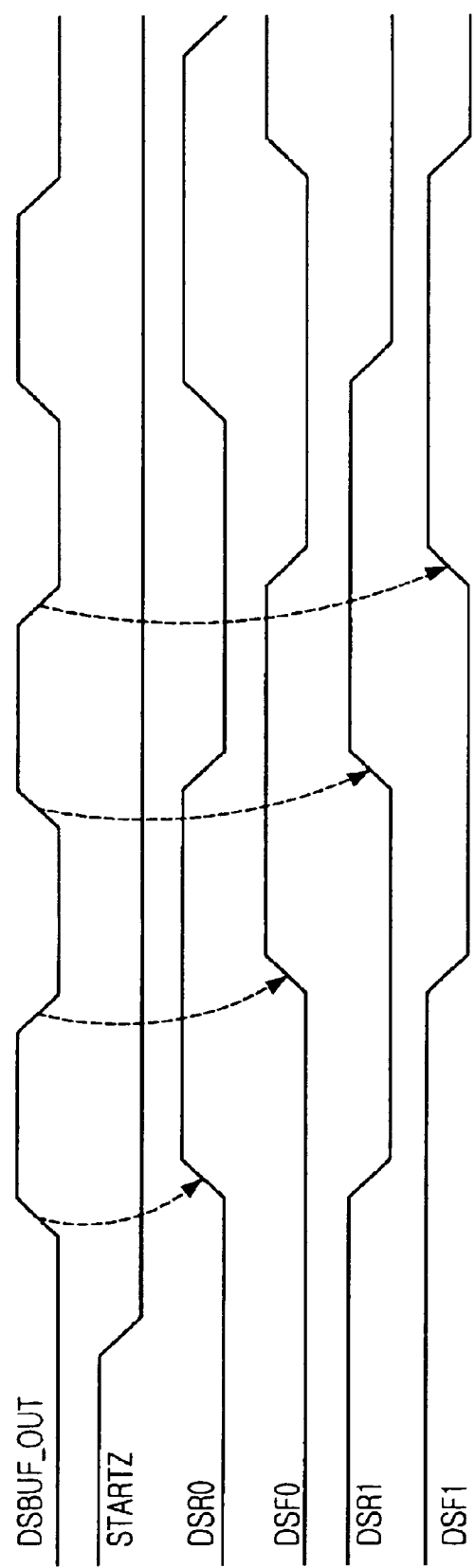
FIG. 6 is a timing diagram demonstrating operation of the data strobe dividing block shown in FIG. 5.

FIG. 6 is a timing diagram demonstrating operation of the data strobe dividing block 420.

The data strobe dividing block 420 in accordance with an embodiment of the present invention outputs the first rising data strobe signal DSR0 synchronized with the first rising edge of the buffered data strobe signal DSBF_OUT, if the strobe enabling signal STARTZ is enabled in response to a writing instruction. Then, the data strobe dividing block 420 sequentially outputs the first falling data strobe signal DSF0 synchronized with the first falling edge of the buffered data strobe signal DSBUF_OUT; the second rising data strobe signal DSR1 synchronized with the second rising edge of the buffered data strobe signal DSBUF_OUT; and the second falling data strobe signal DSF1 synchronized with the second falling edge of the buffered data strobe signal DSBUF_OUT.

The first rising and falling data strobe signals DSR0 and DSF0 and the second rising and falling data strobe signals DSR1 and DSF1 which are respectively inputted to a first latch unit 430, a second latch unit 440, a third latch unit 450 and a forth latch unit 460 are used for latching the buffered input data DIN_OUT at the rising edge of each data strobe signals, i.e., DSR0, DSF0, DSR1 and DSF1. In addition, the first falling data strobe signal DSF0, the second rising data strobe signal DSR1 and the second falling data strobe signal DSF1 are individually inputted to the first to third align units 470 to 490 so that aligned data outputted from the first to third align units 470 to 490 are synchronized with latched data outputted from the forth latch unit 460.

In detail, the first latch unit 430 receives the first rising data strobe signal DSR0 and the buffered input data DIN_OUT outputted from the data input buffer block 410 and latches the buffered input data DIN_OUT at a first rising edge of the first rising data strobe signal DSR0. Then, the first latch unit 430 outputs the first latched data R0_OUT to the first align unit 470 at the next rising edge of the first rising data strobe signal DSR0.

The second latch unit 440 receives the first falling data strobe signal DSF0 and the buffered input data DIN_OUT outputted from the data input buffer block 410 and latches the buffered input data DIN_OUT at a first rising edge of the first falling data strobe signal DSF0. Then, the second latch unit 440 outputs the second latched data F0_OUT to the second align unit 480 at the next rising edge of the first falling data strobe signal DSF0.

The third latch unit 450 receives the second rising data strobe signal DSR1 and the buffered input data DIN_OUT outputted from the data input buffer block 410 and latches the buffered input data DIN_OUT at a first rising edge of the second rising data strobe signal DSR1. Then, the third latch unit 450 outputs the third latched data R1_OUT to the third align unit 490 at the next rising edge of the second rising data strobe signal DSR1.

The forth latch unit 460 receives the second falling data strobe signal DSF1 and the buffered input data DIN_OUT outputted from the data input buffer block 410 and latches the buffered input data DIN_OUT at a first rising edge of the second falling data strobe signal DSF1. Then, the first latch unit 430 outputs a forth aligned data ALIGN_F1_OUT at the next rising edge of the second falling data strobe signal DSF0. Herein, the forth aligned data ALIGN_F1_OUT is outputted from the forth latch unit 460, after synchronized with aligned data outputted from the first to third align units 470 to 490.

Figure 7:
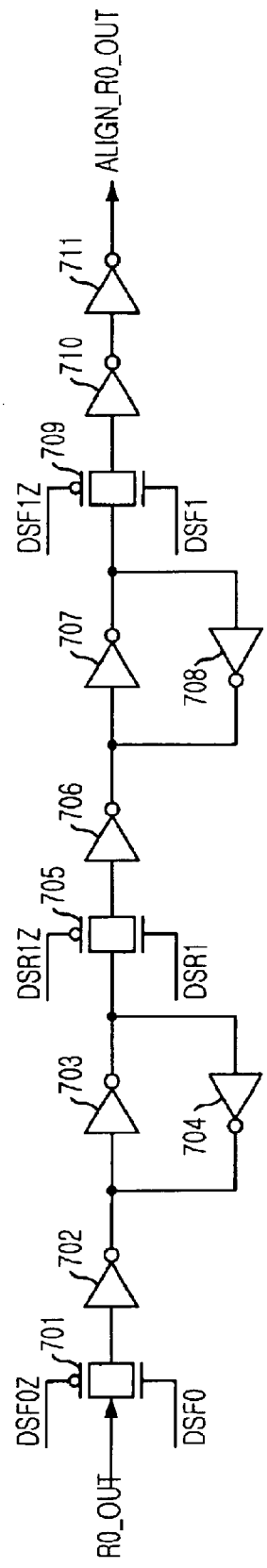
FIG. 7 is a schematic circuit diagram describing a first align unit of the data strobe circuit shown in FIG. 4.

FIG. 7 is a schematic circuit diagram describing the first align unit 470 shown in FIG. 4.

As shown, the first align unit 470 includes a first transmission gate 701 for delivering the first latched data R0_OUT in response to the rising edge of the first rising data strobe signal DSF0, a first inverter 702 for inverting the first latched data R0_OUT outputted from the first transmission gate 701, a second inverter 702 for receiving the inverse first latched data/R0_OUT outputted from the first inverter 702, a third inverter 703 circularly connected to the second inverter 702 for latching the first latched data R0_OUT outputted from the first inverter 702, a second transmission gate 705 for outputting the inverse first latched data/R0_OUT outputted from the second inverter 703 in response to the rising edge of the second rising data strobe signal DSR1, a forth inverter 706 for inverting the inverse first latched data/R0_OUT outputted from the second transmission gate 705, a fifth inverter 707 for receiving the inverse first latched data/R0_OUT outputted from the forth inverter 706, a sixth inverter 708 circularly connected to the fifth inverter 707 for latching the first latched data R0_OUT outputted from the forth inverter 706 and a third transmission gate 709 for outputting the first latched data R0_OUT outputted from the fifth inverter 707 in response to the rising edge of the second falling data strobe signal DSF1.

Namely, the first align unit 470 receives the first latched data R0_OUT, the first falling data strobe signal DSF0, the second rising data strobe signal DSR1 and the second falling data strobe signal DSF1 and outputs the first aligned data ALIGN_R0_OUT, i.e., the first latched data R0_OUT which is synchronized with the second falling data strobe signal DSF1.

Figure 8:
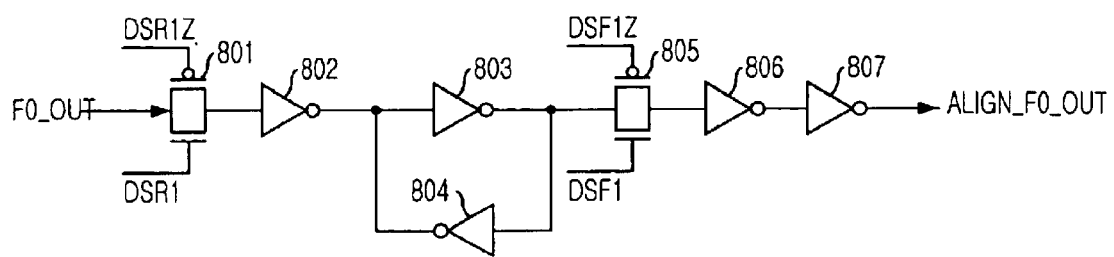
FIG. 8 is a schematic circuit diagram showing a second align unit of the data strobe circuit shown in FIG. 4.

FIG. 8 is a schematic circuit diagram showing the second align unit 480 shown in FIG. 4.

As shown, the second align unit 480 includes a forth transmission gate 801 for delivering the second latched data F0_OUT in response to the rising edge of the second rising data strobe signal DSR1, a sixth inverter 802 for inverting the second latched data F0_OUT outputted from the forth transmission gate 801, a seventh inverter 803 for receiving the inverse second latched data/F0_OUT outputted from the sixth inverter 802, a eight inverter 804 circularly connected to the seventh inverter 803 for latching the second latched data F0_OUT outputted from the seventh inverter 803 and a fifth transmission gate 805 for outputting the second latched data F0_OUT outputted from the seventh inverter 803 in response to the rising edge of the second falling data strobe signal DSF1.

The second align unit 480 receives the second latched data F0_OUT, the second rising data strobe signal DSR1 and the second falling data strobe signal DSF1 and outputs the second aligned data ALIGN_F0_OUT, i.e., the second latched data F0_OUT which is synchronized with the second falling data strobe signal DSF1.

Figure 9:
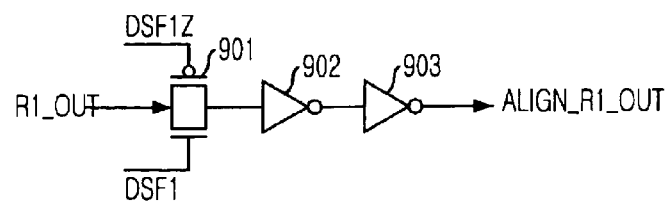
FIG. 9 is a schematic circuit diagram describing the third align unit of the data strobe circuit shown in FIG. 4.

FIG. 9 is a schematic circuit diagram describing the third align unit 490 shown in FIG. 4.

As shown, the third align unit 490 includes a sixth transmission gate 901 for delivering the third latched data R1_OUT in response to the rising edge of the second falling data strobe signal DSF1. The third align unit 490 receives the third latched data R1_OUT and the second falling data strobe signal DSF1 and outputs the third aligned data ALIGN_R1_OUT, i.e., the third latched data R1_OUT which is synchronized with the second falling data strobe signal DSF1.

Figure 10:
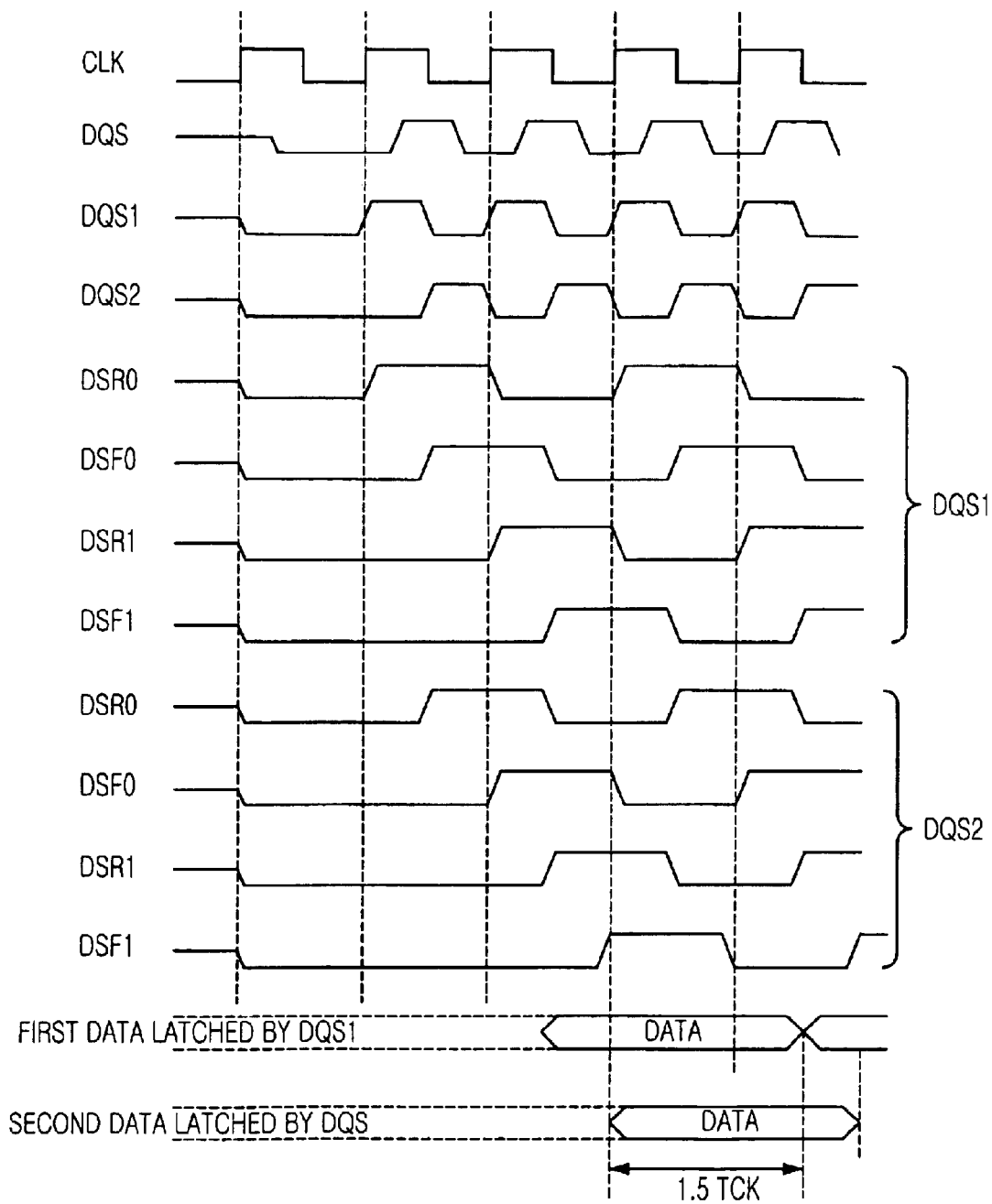
FIG. 10 is a timing diagram demonstrating operation of the data strobe circuit shown in FIG. 4.

FIG. 10 is a timing diagram demonstrating operation of the data strobe circuit shown in FIG. 4.

As shown, timing margin is about 1.5 tCK since a first data is latched by a first data strobe signal DQS1 which is the earliest inputted signal of data strobe signals DQS to DQS2 until a second data is latched by a second data strobe signal DQS2 which is the latest inputted signal of data strobe signals DQS to DQS2. This timing margin of the inventive data strobe circuit, i.e., 1.5 tCK is longer about 1 tCK than that of the prior data strobe circuit, i.e., 0.5 tCK.

Figure 11:
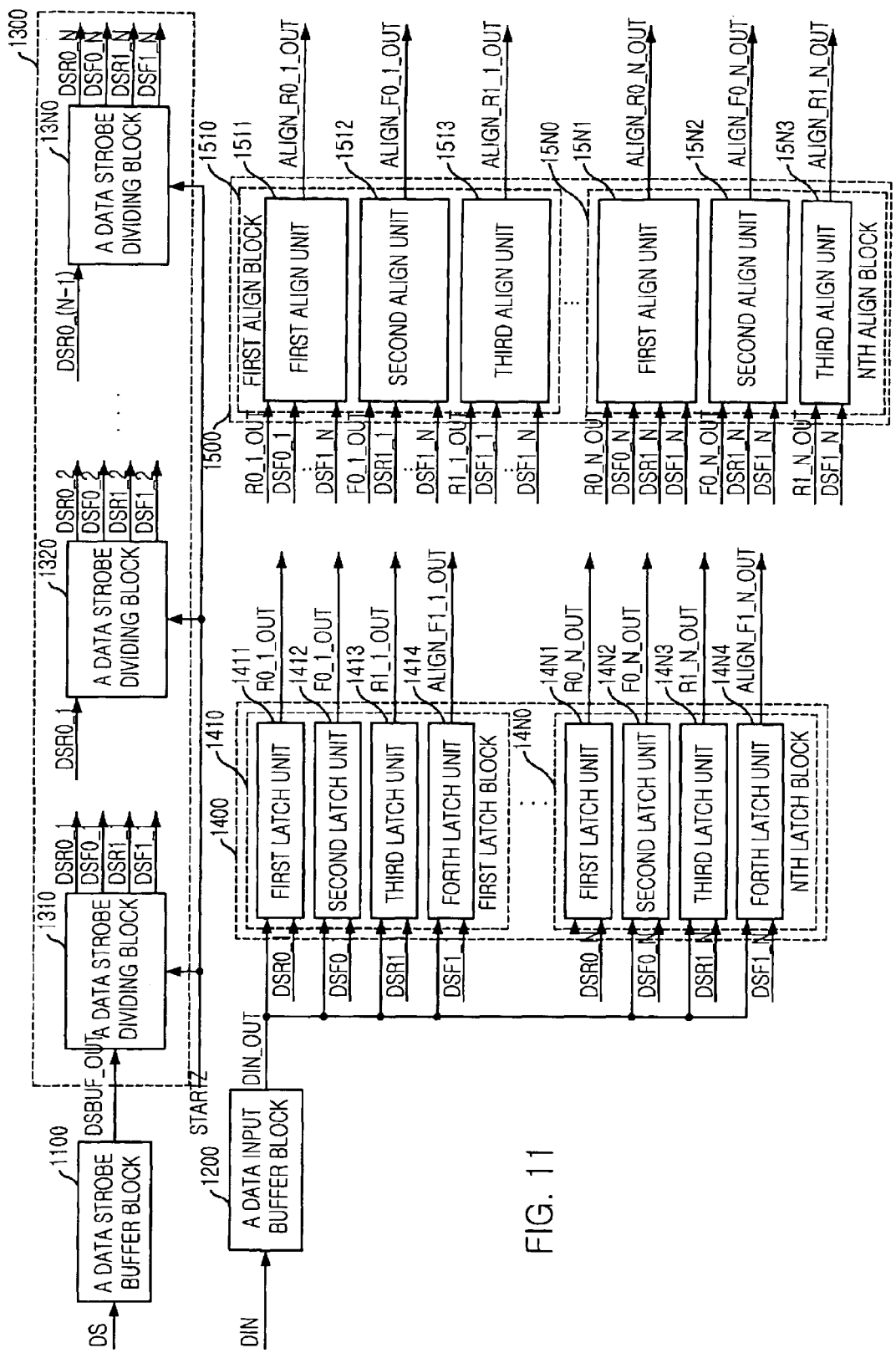
FIG. 11 is a block diagram showing a data strobe circuit in accordance with another embodiment of the present invention.

FIG. 11 is a block diagram showing a data strobe circuit in accordance with another embodiment of the present invention. The data strobe circuit of this embodiment can be applied to semiconductor memory devices which can simultaneously prefetch $2^n$ bits data.

As shown, a data strobe multi-dividing block 1300 includes a plurality of data strobe dividing units 1310 to 13N0. A multi-latch block 1410 also has a plurality of latch blocks 1410 to 14N0, and a multi-align block 1510 contains a plurality of align block 1510 to 15N0. Because each latch block latches one data group, the data strobe circuit can prefetch N data groups, i.e., the $2^n$ bits data (N is a positive integer). Herein, each data strobe dividing unit, e.g., 1310, each latch block, e.g., 1410 and each align block, e.g., 1510 are similar to those shown in FIG. 4. For the sake of convenience, the detailed description about operation of those blocks is omitted.

In the other hand, there is a data align block in accordance with another embodiment of the present invention. Referring to FIGS. 4 and 11, the first align unit, e.g., 470 and a first data align unit, e.g., 1511 of the first align block, e.g., 1510 respectively receives three data strobe signals. However, each unit 470 or 1511 can align inputted data without receiving the data strobe signal DSR1 or DSR1_1 respectively. For instance, the transmission gate 705 and the three inverters 706, 707 and 708 are not essential elements, so these elements can be removed in the first align unit 470. Because the first align unit 470 contains loop-connected inverters 703 and 704 for temporary storing the inputted data, the first align unit 470 can align the inputted data by receiving only the data strobe signals DSF0 and DSF1.

In this case, the data strobe circuit can be embodied by reducing the number of transistors contained in the data align unit. As a result, even if timing margin in operation of the data strobe circuit is kept as it stands, the current consumption is reduced and the total area of the data strobe circuit is decreased.

The semiconductor memory device having the data strobe circuit in accordance with the present invention has the advantage of stable writing operation by guaranteeing enough timing margin.

While the present invention has been described with respect to the particular embodiments, it will be apparent to those skilled in the art that various changes and modification may be made without departing from the spirit and scope of the invention as defined in the following claims.

What is claimed is:

1. A data strobe circuit for prefetching M number of N bit data, N and M being a positive integer, comprising:
    a data strobe buffering means for generating N number of align control signals based on a data strobe signal;
    a synchronizing block having M number of latch blocks, each for receiving N bit data and outputting the N−1 bit data in a parallel fashion in response to N−1 number of the align control signals and one bit prefetched data in response to the remaining align control signals; and
    a output block having M number of aligning blocks, each for receiving the N−1 bit data in the parallel fashion, synchronizing the N−1 bit data with the align control signal and outputting the synchronized N−1 bit data as the N−1 bit prefetched data.

2. The data strobe circuit as recited in claim 1, wherein at least one or more align control signals have a period at least twice longer than period of the data strobe signal.

3. The data strobe circuit as recited in claim 1, wherein the synchronizing block includes the M number of latch blocks, each having N number of latches, each for latching one bit data in response to one align control signal.

4. The data strobe circuit as recited in claim 1, wherein the output block includes the M number of aligning blocks, each having N−1 number of aligning units, each for receiving at least one align control signal, synchronizing one bit data with the align control signal and outputting the one bit synchronized data as the one bit prefetched data.

5. The data strobe circuit as recited in claim 1, wherein the N is 4.

6. The data strobe circuit as recited in claim 5, wherein the data strobe dividing means generates first rising and falling data strobe signals and second rising and falling data strobe signals in response to rising and falling edges of the data strobe signal.

7. The data strobe circuit as recited in claim 6, wherein the synchronizing block includes at least one latch block for latching the 4 bit data inputted in response to the first rising and falling data strobe signals and the second rising and falling data strobe signals and outputting one bit latched data in response to the second falling data strobe signal as the one bit prefetched data.

8. The data strobe circuit as recited in claim 7, wherein the output block includes at least one aligning block for receiving the 3 bit data inputted from the latch means in response to the first falling data strobe signal, the second rising data strobe signal and the second falling data strobe signal and simultaneously outputting the 3 bit synchronized data as the 3 bit prefetched data.

9. The data strobe circuit as recited in claim 6, wherein a rising edge of the first rising data strobe signal corresponds with a rising edge at a first period of the original data strobe signal; a rising edge of the first falling data strobe signal corresponds with a falling edge at a first period of the original data strobe signal; a rising edge of the second rising data strobe signal corresponds with a rising edge at a second period of the original data strobe signal; and a rising edge of the second rising data strobe signal corresponds with a falling edge at a second period of the original data strobe signal.

10. The data strobe circuit as recited in claim 9, wherein the latch block includes:
    a first rising latch for latching a first data in response to the rising edge of the first rising data strobe signal;
    a first falling latch for latching a second data in response to the rising edge of the first falling data strobe signal;
    a second rising latch for latching a third data in response to the rising edge of the second rising data strobe signal; and
    a second falling latch for latching a forth data in response to the rising edge of the second falling data strobe signal.

11. The data strobe circuit as recited in claim 10, wherein the aligning block includes:
    a first rising align block for simultaneously outputting the first data latched by the first rising latch block at the point of timing when the forth data is outputted from the second falling latch block;
    a first falling align block for simultaneously outputting the second data latched by the first falling latch block at the point of timing when the forth data is outputted from the second falling latch block; and
    a second rising align block for simultaneously outputting the third data latched by the second rising latch block at the point of timing when the forth data is outputted from the second falling latch block.

12. The data strobe circuit as recited in claim 11, wherein the first rising align block includes
    a first transmission gate for delivering the inputted first datum in response to the rising edge of the first falling data strobe signal;
    a first inverter for inverting the first datum outputted from the first transmission gate;
    a second inverter for receiving the inverse first datum outputted from the first inverter;
    a third inverter circularly connected to the second inverter for latching the first datum outputted from the first inverter;
    a second transmission gate for outputting the first datum outputted from the second inverter in response to the rising edge of the second rising data strobe signal;
    a forth inverter for inverting the first datum outputted from the second transmission gate;
    a fifth inverter for receiving the inverse first datum outputted from the forth inverter;
    a sixth inverter circularly connected to the fifth inverter for latching the first datum outputted from the forth inverter; and
    a third transmission gate for outputting the first datum outputted from the fifth inverter in response to the rising edge of the second falling data strobe signal.

13. The data strobe circuit as recited in claim 11, wherein the first falling align block includes
    a first transmission gate for delivering the inputted second datum in response to the rising edge of the second rising data strobe signal;
    a first inverter for inverting the second datum outputted from the first transmission gate;
    a second inverter for receiving the inverse second datum outputted from the first inverter;
    a third inverter circularly connected to the second inverter for latching the second datum outputted from the first inverter; and
    a second transmission gate for outputting the second datum outputted from the second inverter in response to the rising edge of the second falling data strobe signal.

14. The data strobe circuit as recited in claim 11, wherein the second rising align block includes
    a first transmission gate for delivering the inputted third datum in response to the rising edge of the second falling data strobe signal.

15. The data strobe circuit as recited in claim 11, wherein the first rising align block includes
    a first transmission gate for outputting the first datum outputted from the fifth inverter in response to the rising edge of the second falling data strobe signal.

16. The data strobe circuit as recited in claim 11, wherein the first falling align block includes
    a first transmission gate for outputting the first datum outputted from the fifth inverter in response to the rising edge of the second falling data strobe signal.

* * * * *